United States Patent
Gupta et al.

(10) Patent No.: US 8,860,464 B2
(45) Date of Patent: Oct. 14, 2014

(54) ZERO KEEPER CIRCUIT WITH FULL DESIGN-FOR-TEST COVERAGE

(71) Applicant: Apple Inc., Cupertino, CA (US)

(72) Inventors: Hitesh K Gupta, Santa Clara, CA (US); Greg M Hess, Mountain View, CA (US); Naveen Javarappa, San Jose, CA (US)

(73) Assignee: Apple Inc., Cupertino, CA (US)

( * ) Notice: Subject to any disclaimer, the term of this patent is extended or adjusted under 35 U.S.C. 154(b) by 153 days.

(21) Appl. No.: 13/725,784

(22) Filed: Dec. 21, 2012

(65) Prior Publication Data

US 2014/0177354 A1      Jun. 26, 2014

(51) Int. Cl.
  *H03K 3/037*   (2006.01)
  *H03K 19/00*   (2006.01)
  *G11C 7/00*    (2006.01)

(52) U.S. Cl.
  CPC . *G11C 7/00* (2013.01); *H03K 19/00* (2013.01)
  USPC .......................................................... 326/95

(58) Field of Classification Search
  CPC ..................................................... H03K 3/037
  USPC .......................................................... 326/95
  See application file for complete search history.

(56) References Cited

U.S. PATENT DOCUMENTS

| | | | |
|---|---|---|---|
| 6,404,235 B1 | 6/2002 | Nowka et al. | |
| 7,358,775 B2 | 4/2008 | Bertram | |
| 7,710,155 B2 * | 5/2010 | Bhatia et al. | 326/93 |
| 2009/0085601 A1 * | 4/2009 | Nintunze et al. | 326/8 |
| 2009/0167358 A1 * | 7/2009 | Seal | 326/98 |
| 2011/0068842 A1 * | 3/2011 | Hoxey | 327/199 |
| 2012/0133408 A1 * | 5/2012 | Bazes | 327/218 |

* cited by examiner

*Primary Examiner* — Hoai V Ho
*Assistant Examiner* — Min Huang
(74) *Attorney, Agent, or Firm* — Meyertons, Hood, Kivlin, Kowert & Goetzel. P.C.

(57) ABSTRACT

A zero keeper circuit includes a dynamic input PFET connected to a source, an output, and a dynamic input. The circuit also includes a clock input NFET connected to the output, a pull-down node, and a clock input. The circuit also includes a dynamic input NFET connected to the pull-down node, a reference voltage, and the dynamic input. The circuit also includes a feedback PFET and a clock input PFET connected in series between the source and the output. The feedback PFET receives a feedback signal and the clock input PFET receives the clock input. The circuit also includes a feedback NFET connected to the output and the node. The feedback NFET is configured to couple the output to the node based on the feedback signal. The circuit also includes a NOR gate configured to provide the feedback signal based on the output and a bypass input.

25 Claims, 5 Drawing Sheets

ZERO KEEPER CIRCUIT WITH FULL DESIGN-FOR-TEST COVERAGE

BACKGROUND

1. Technical Field

This disclosure relates generally to zero keeper circuits and, more particularly, to zero keeper circuits configured for design-for-test (DFT) coverage, methods for controlling such a zero keeper circuit, devices that include such a zero keeper circuit, and memory apparatus that include such a zero keeper circuit.

2. Description of the Related Art

A zero keeper circuit, also referred to as a dynamic to static converter, is a circuit configured to receive a dynamic signal and convert the dynamic signal to a static signal. An output of zero keeper circuit may be coupled to critical logic. Designers may desire to scan such logic with design-for-test (DFT) techniques. In typical configurations, however, the output of a zero keeper circuit can be set to only a single value, either a logic high or a logic low. If, for example, a zero keeper circuit output is coupled to an OR gate and can be set only to a logic high, DFT coverage is lost for the downstream logic. If, in another example, a zero keeper circuit output is coupled to an AND gate and can only be set to a logic low, DFT coverage is again is lost for the downstream logic. Although an inverter may be placed at the output of the zero keeper, just before the AND or OR gate to reverse the polarity of the zero keeper output signal, additional logic introduced in the output path results in a loss of speed of transitioning signals.

SUMMARY

Various example zero keeper circuits, methods of controlling an output of such a zero keeper circuit, devices that include such a zero keeper circuit, and memory apparatus that include such zero keeper circuits are disclosed. One example zero keeper circuit may include a dynamic input PFET connected to a power source and a zero keeper output. The dynamic input PFET may be configured to couple the power source to the zero keeper output based on a dynamic input. The example zero keeper circuit may also include a clock input NFET connected to the zero keeper output and a pull-down node. The clock input NFET may be configured to couple the zero keeper output to the pull-down node based on the clock input. The example zero keeper circuit may also include a dynamic input NFET connected to the pull-down node and a reference voltage. The dynamic input NFET may be configured to couple the pull-down node to the reference voltage based on the dynamic input. The example zero keeper circuit may also include a feedback PFET and a clock input PFET connected in series between the power source and the zero keeper output. The feedback PFET may be selectively enabled based on a feedback signal and the clock input PFET may be selectively enabled based on the clock input. The example zero keeper circuit may also include a feedback NFET connected to the zero keeper output and the pull-down node. The feedback NFET may be configured to couple the zero keeper output to the pull-down node based on the feedback signal. The example zero keeper circuit may also include a NOR gate configured to output the feedback signal based on the zero keeper output and a bypass input.

One example method of controlling the output of such a zero keeper circuit may include forcing the zero keeper output to a logic high by setting the bypass input to a logic high and holding the clock input to a logic low. Another example method of controlling the output of such a zero keeper circuit may include forcing the zero keeper output to a logic low by setting the dynamic input to a logic high, setting the bypass input to a logic low, and allowing the clock input to toggle between logic low and logic high periodically.

Example devices disclosed in this specification may include, among other components, a memory array and a zero keeper circuit. The zero keeper circuit may be coupled to a read output of the memory array. The zero keeper circuit may be configured to convert dynamic signals of the read output of the memory array into static signals. The zero keeper circuit may be otherwise configured as the example zero keeper circuit described above.

Example memory apparatus disclosed in this specification may include an array of memory cells, a read output, and a zero keeper circuit. The zero keeper circuit may be coupled to the read output of the array of memory cells and may be configured to convert dynamic signals of the read output to static signals. The zero keeper circuit of the memory apparatus may be otherwise configured as the example zero keeper circuit described above.

Figure 1:
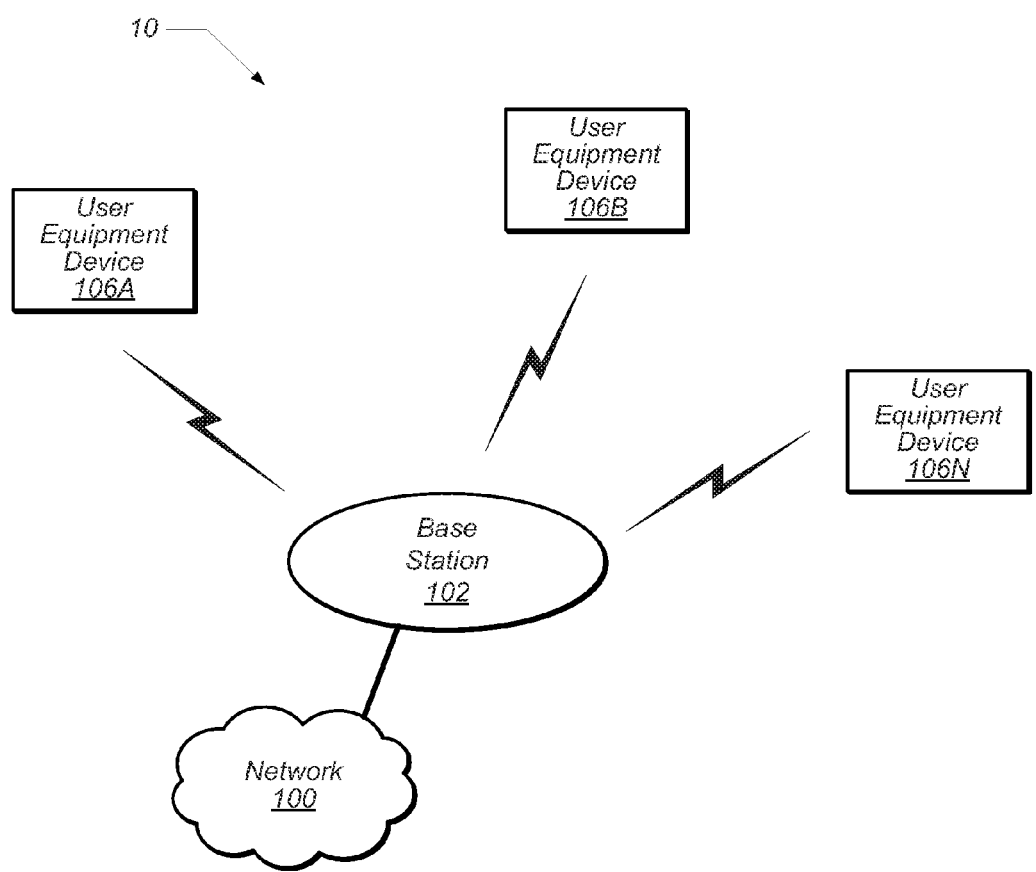
FIG. 1 sets forth a block diagram of one embodiment of a wireless communication system.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

FIG. 1 sets forth a block diagram of one embodiment of a wireless communication system. The system of FIG. 1 is one example of any of a variety of wireless communication systems. The wireless communication system 10 includes a base station 102 which communicates over a wireless transmission medium such as, for example, an over the air interface with one or more user equipment (UE) devices, 106A through 106N. The base station 102 is also coupled a network 100 via another interface, which may be wired or wireless. Components identified by reference designators that include both a number and a letter may be referred to by the only a number where appropriate.

The base station 102 may be a base transceiver station (BTS) or cell site, and may include hardware that enables wireless communication with one or more of the UEs 106. The base station 102 may also be equipped to communicate with the network 100. Thus, the base station 102 may facilitate communication between the UEs 106 and/or between the UEs 106 and the network 100. The communication area (or coverage area) of the base station 102 may be referred to as a "cell." In various embodiments, the base station 102 and the UEs may be configured to communicate over the transmission medium using any of various wireless communication radio access technologies such as LTE, eHRPD, GSM, CDMA, WLL, WAN, WiFi, WiMAX, etc. In embodiments that communicate using the eHRPD standard, the BTS 102 may be referred to as an HRPD BTS, and the network 100 may include an eAN/ePCF and a number of gateways including HRPD gateway (HSGW), a PDN gateway (P-GW), and a number of policy and packet control functions that may be associated with a service provider, for example.

In one embodiment, each of the UEs 106A-106N may be representative of a device with wireless network connectivity such as a mobile phone, a hand-held device, a computer or a tablet, or virtually any type of wireless device. As described further below, the UE 106 may include at least one processor that is configured to execute program instructions stored in a memory. Accordingly, in some embodiments, the UE 106 may perform one or more portions of the functionality described below by executing such stored instructions. However, in other embodiments, the UE 106 may include one or more hardware elements and/or one or more programmable hardware elements such as an FPGA (field-programmable gate array) that may be configured to perform the one or more portions the functionality described below. In still other embodiments, any combination of hardware and software may be implemented to perform the functionality described below.

In the system 10 of FIG. 1, any of the UEs 106 may include a zero keeper circuit. In some embodiments, a UE 106 may include a memory array having a read output. In such embodiments, the zero keeper circuit may be coupled to the memory array and may be configured to convert dynamic signals of the read output to static signals. The zero keeper circuit may include a dynamic input PFET connected to a power source and a zero keeper output. Here, and throughout the specification, some FETs are labeled with respect to an input signal coupled to a gate, source, or drain of the transistor for purposes of clarity of explanation. The dynamic input PFET, for example, is coupled to a the dynamic input via the PFET's gate. As such, the PFET is described as a dynamic input PFET. The dynamic input PFET may be configured to couple the power source to the zero keeper output based on a dynamic input. The zero keeper circuit may also include a clock input NFET connected to the zero keeper output and a pull-down node. The clock input NFET may be configured to couple the zero keeper output to the pull-down node based on the clock input. The zero keeper circuit may also include a dynamic input NFET connected to the pull-down node and a reference voltage. The dynamic input NFET may be configured to couple the pull-down node to the reference voltage based on the dynamic input. The zero keeper circuit may also include a feedback PFET and a clock input PFET connected in series between the power source and the zero keeper output. The feedback PFET may be selectively enabled based on a feedback signal and the clock input PFET may be selectively enabled based on the clock input. The zero keeper circuit may also include a feedback NFET connected to the zero keeper output and the pull-down node. The feedback NFET may be configured to couple the zero keeper output to the pull-down node based on the feedback signal, The zero keeper circuit may also include a NOR gate configured to output the feedback signal based on the zero keeper output and a bypass input.

The output of such a zero keeper circuit, depending on the type of downstream logic, may be controllably set to a logic high or a logic low. In some embodiments, the zero keeper output may be forced to a logic high by setting the bypass input to a logic high and holding the clock input to a logic low. In some embodiments, the zero keeper output may be forced to a logic low by setting the dynamic input to a logic high, setting the bypass input to a logic low, and allowing the clock input to toggle between logic low and logic high periodically. In some embodiments, the dynamic input's normal state is logic high such that 'setting' the dynamic input to a logic high may be carried out by allowing the dynamic input to remain at its normal state.

Figure 2:
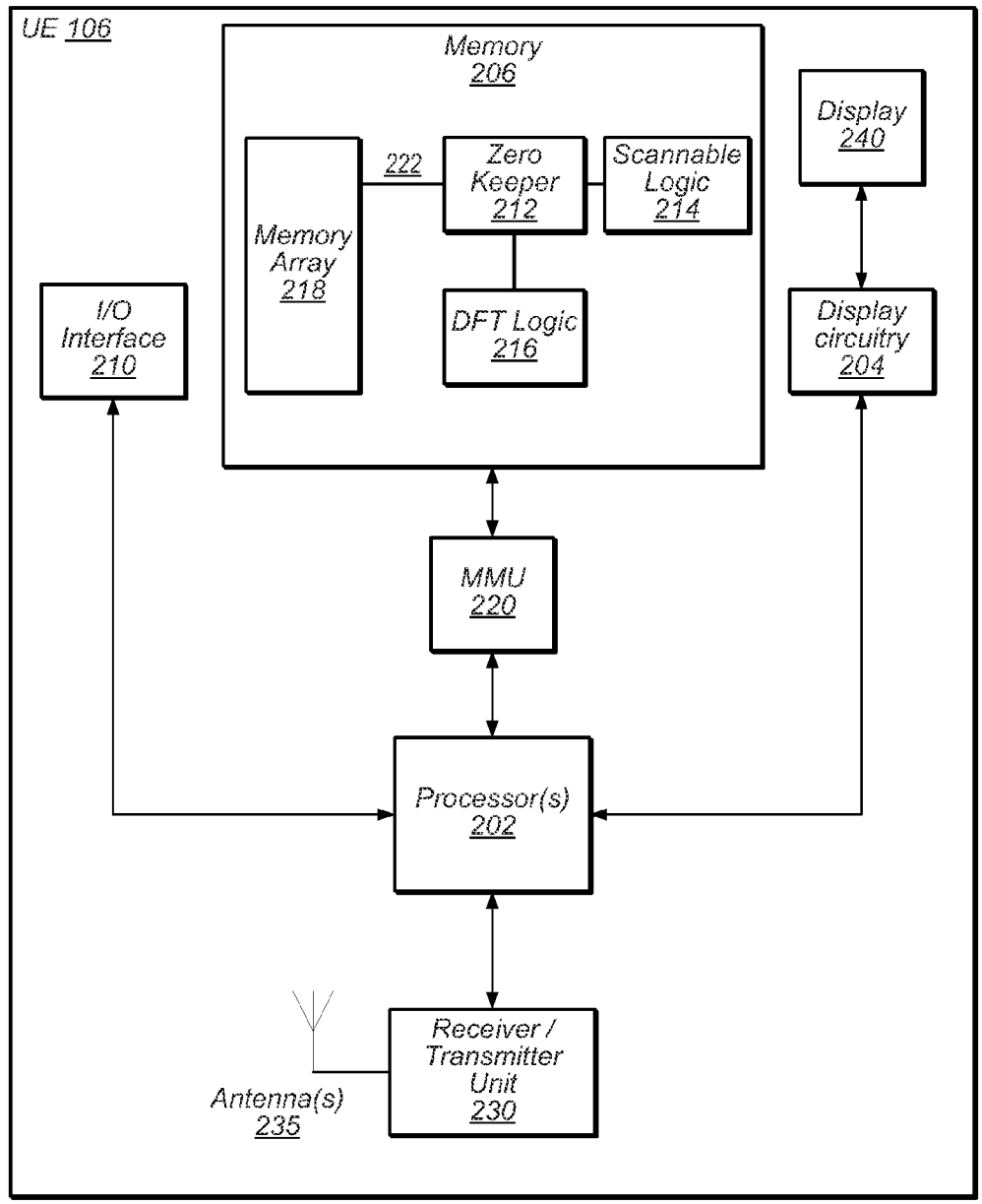
FIG. 2 sets forth a block diagram of one embodiment of a wireless communication device shown in FIG. 1.

For further explanation, FIG. 2 sets forth a block diagram of one embodiment of a wireless communication device shown in FIG. 1. The UE 106 includes one or more processors 202 (or one or more processor cores 202) which are coupled to display circuitry 204 which is in turn coupled to the display 240. The display circuitry 204 may be configured to perform graphics processing and provide display signals to the display 240.

The one or more processors 202 are also coupled to a memory management unit (MMU) 220 and to a receiver/transmitter (R/T) unit 230. The MMU 220 is coupled to a memory 206. The UE 106 also includes an I/O interface 210 that is coupled to the processor(s) 202, and may be used for coupling the UE 106 to a computer system, or other external device. It is noted that in one embodiment the components shown within UE 106 of FIG. 2 may be manufactured as standalone components. In other embodiments, however, various ones of the components may be part of one or more chipsets or part of a system on chip (SOC) implementation.

In various embodiments, the processors 202 may be representative of a number of different types of processors that may be found in a wireless communication device. For example, the processors 202 may include general processing capability, digital signal processing capability, as well as hardware accelerator functionality, as desired. The processors 202 may include baseband processing and therefore may digitally process the signals received by the R/T unit 230. The processors 202 may also process data that may be transmitted by the R/T unit 230. The processors 202 may also perform a number of other data processing functions such as running an operating system and user applications for the UE 106.

In one embodiment, the MMU 220 may be configured to receive addresses from the one or more processors 202 and to translate those addresses to locations in memory (e.g., memory 206) and/or to other circuits or devices, such as the display circuitry 204, R/T unit 230, and/or display 240. The MMU 220 may also return data to one or more of the processors 202 from the locations in memory 206. The MMU 220 may be configured to perform memory protection and page table translation or set up. In some embodiments, the MMU 220 may be included as a portion of one or more of the processors 202.

The R/T unit 230 may, in one embodiment, include analog radio frequency (RF) circuitry for receiving and transmitting RF signals via the antenna 235 to perform the wireless communication. The R/T unit 230 may also include down-conversion circuitry to lower the incoming RF signals to the baseband or intermediate frequency (IF) as desired. For example, the R/T unit 230 may include various RF and IF filters, local oscillators, mixers, and the like. Since the UE 106 may operate according to a number of radio access technologies, the R/T unit 230 may include a corresponding number of RF front end portions to receive and down-convert, as well as up-convert and transmit the respective RF signals of each technology.

The memory 206 of the example UE 106 may also include an array 218 of memory cells, where the array has a read output 222. The read output 222 may be coupled to a zero keeper circuit 212. The zero keeper circuit may be configured to convert dynamic signals of the read output 222 to static signals. The zero keeper circuit 212 may be configured in a manner similar to the zero keeper circuit described above with respect to FIG. 1. As described below in greater detail with respect to FIGS. 3A, 3B, 4A, and 4B, the zero keeper output may be coupled to scannable logic 214 through an AND gate, an OR gate, an inverter in series with an AND gate, or an inverter in series with an OR gate. While one input of the gate (AND or OR) is coupled to the zero keep output, the other input may be coupled to DFT logic 216, such as a scannable FLOP or other device. In this way, controlling the zero keeper output may effectively bypass the zero keeper circuit and enable the DFT logic 216 to provide full DFT coverage of the downstream scannable logic 214. Consider, for example, an example zero keeper output coupled to an input of an AND gate. In such an example, setting (and holding) the zero keeper output to a logic high enables the DFT logic 216 to toggle the input, and thus the output of the AND gate, between logic high and logic low. It is noted that the term 'AND gate' and 'OR gate' as used in specification when describing logic coupled to the zero keeper output may be any type of logic that performs an 'ANDing' function or 'ORing' function, respectively.

Figure 3A:
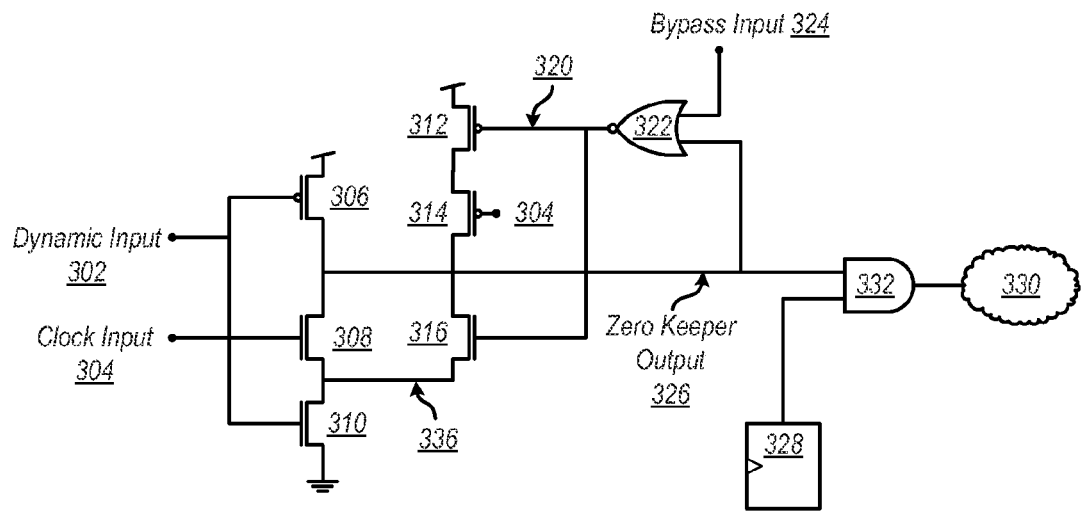
FIG. 3A sets forth a diagram of an example zero keeper circuit having a controllable output signal.

FIG. 3A sets forth a diagram of an example zero keeper circuit having a controllable output signal. The example zero keeper circuit of FIG. 3A includes a dynamic input PFET 306 connected to a power source and the zero keeper output 326. The dynamic input PFET 306 is configured to couple the power source to the zero keeper output 326 based on a dynamic input 302.

The example zero keeper circuit of FIG. 3A also includes a clock input NFET 308 connected to the zero keeper output 326 and a pull-down node 336. The clock input NFET 308 is configured to couple the zero keeper output 326 to the pull-down node 336 based on the clock input 304.

The example zero keeper circuit of FIG. 3A also includes a dynamic input NFET 310 connected to the pull-down node 336 and a reference voltage. The dynamic input NFET 310 is configured to couple the pull-down node 336 to the reference voltage based on the dynamic input 302.

The example zero keeper circuit of FIG. 3A also includes a feedback PFET 312 and a clock input PFET 314 connected in series between the power source and the zero keeper output 326. The feedback PFET 312 is selectively enabled based on a feedback signal 320 and the clock input PFET 314 is selectively enabled based on the clock input 304.

The example zero keeper circuit of FIG. 3A also includes a feedback NFET 316 connected to the zero keeper output 326 and the pull-down node 336. The feedback NFET 316 is configured to couple the zero keeper output 326 to the pull-down node based on the feedback signal 320.

The example zero keeper circuit of FIG. 3A also includes a NOR gate 322 configured to output the feedback signal 320 based on the zero keeper output 326 and a bypass input 324.

The example zero keeper circuit of FIG. 3A also includes an AND gate 332 having a first input coupled to the zero keeper output 326 and a second input coupled to a selectively controllable output of a Design-For-Test ('DFT') module 328. The AND gate 332 also has an output coupled to scannable logic circuitry 330. The zero keeper output 326 is configured to bypass, upon being forced to a logic high, the zero keeper circuit of FIG. 3A for DFT activity through the AND gate.

In the example zero keeper circuit of FIG. 3A, the zero keeper output 326 may be forced to a logic high upon the bypass input 324 being set to a logic high and the clock input 304 being held to a logic low.

Figure 3B:
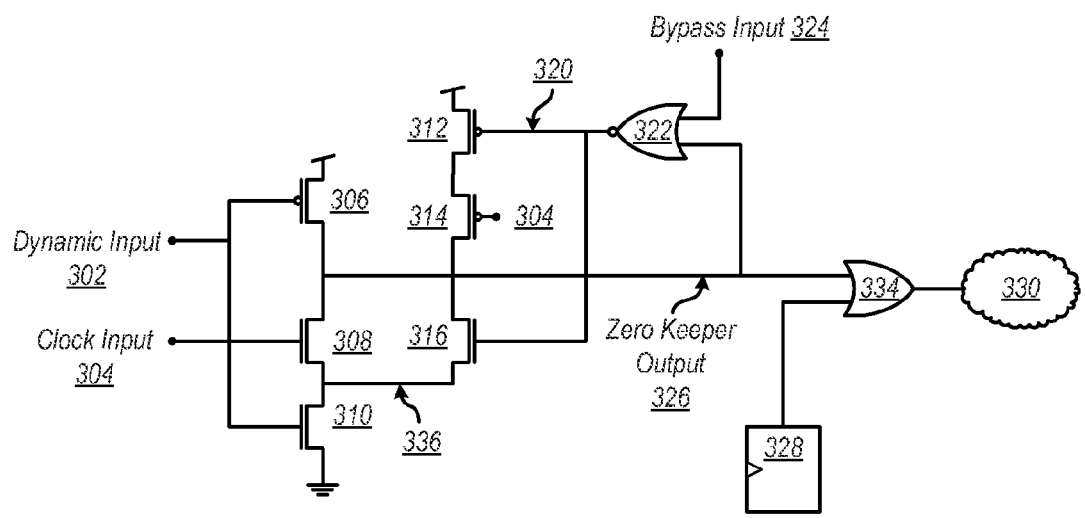
FIG. 3B sets forth a diagram of another example zero keeper circuit having a controllable output signal.

For further explanation, FIG. 3B sets forth a diagram of another example zero keeper circuit. The example zero keeper circuit of FIG. 3B is similar to the zero keeper circuit of FIG. 3A except that the zero keeper output 326 in the example of FIG. 3B is coupled to an OR gate 334 rather than an AND gate. That is, the example zero keeper circuit of FIG. 3B includes an OR gate 334 having a first input coupled to the zero keeper output 326 and a second input coupled to a selectively controllable output of a DFT module 328. The OR gate 334 also has an output coupled to scannable logic circuitry 330. The zero keeper output 326 may be configured to bypass, upon being forced to a logic low, the zero keeper circuit for DFT activity through the OR gate 334. The zero keeper output 326 of the example circuit of FIG. 3B may be forced to a logic low by setting the dynamic input 302 to a logic high, setting the bypass input 324 to a logic low, and allowing the clock input 304 to toggle between logic low and logic high periodically.

Figure 4A:
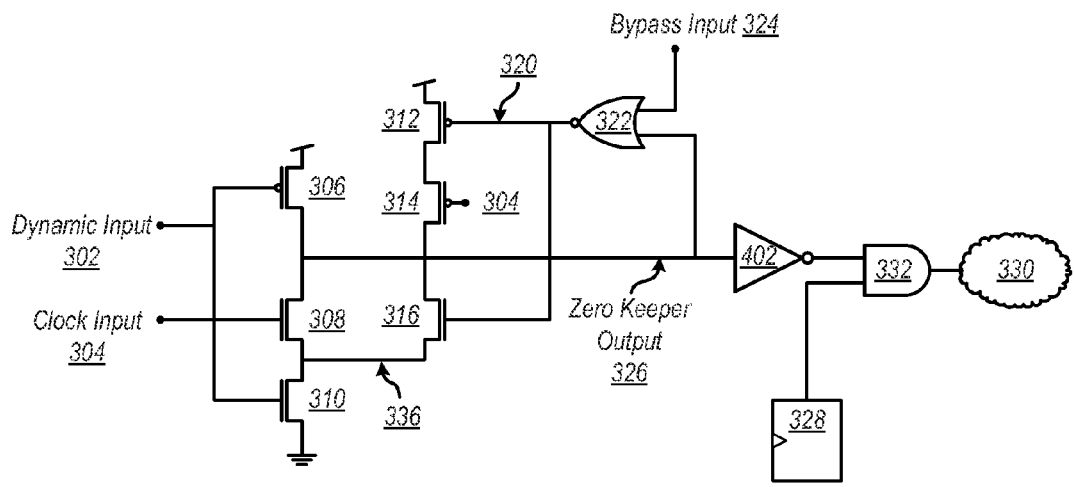
FIG. 4A sets forth a diagram of another example zero keeper circuit having a controllable output signal.

For further explanation, FIG. 4A sets forth a diagram of another example zero keeper circuit having a controllable output signal. The example zero keeper circuit of FIG. 4A is similar to the example zero keeper circuit of FIG. 3A. The example zero keeper circuit of FIG. 4A differs from that of FIG. 3A, however, in that the zero keeper output 326 is coupled to an inverter 402. The output of the inverter 402 is coupled to a first input of an AND gate 332 and a second input of the AND gate 332 is coupled to a selectively controllable output of a DFT module 328. The output of the AND gate 332 is coupled to scannable logic circuitry 330. In such an example circuit, forcing the zero keeper output 326 to a logic low (as described above) bypasses the zero keeper circuit for DFT activity through the AND gate 332.

Figure 4B:
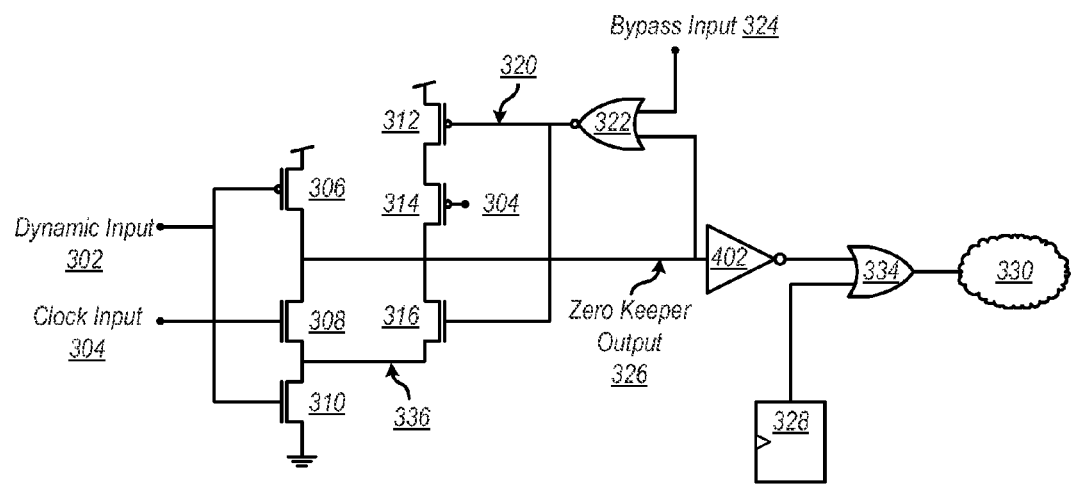
FIG. 4B sets forth a diagram of another example zero keeper circuit having a controllable output signal.

For further explanation, FIG. 4B sets forth a diagram of another example zero keeper circuit having a controllable output signal. The example zero keeper circuit of FIG. 4B is similar to the example zero keeper circuit of FIG. 3A. The example zero keeper circuit of FIG. 4B differs from that of FIG. 3A, however, in that the zero keeper output 326 is coupled to an inverter 402. The output of the inverter 402 is coupled to a first input of an OR gate 334 and a second input of the OR gate 334 is coupled to a selectively controllable output of a DFT module 328. The output of the OR gate 334 is coupled to scannable logic circuitry 330. In such an example circuit, forcing the zero keeper output 326 to a logic high (as described above) bypasses the zero keeper circuit for DFT activity through the OR gate 334.

Figure 5:
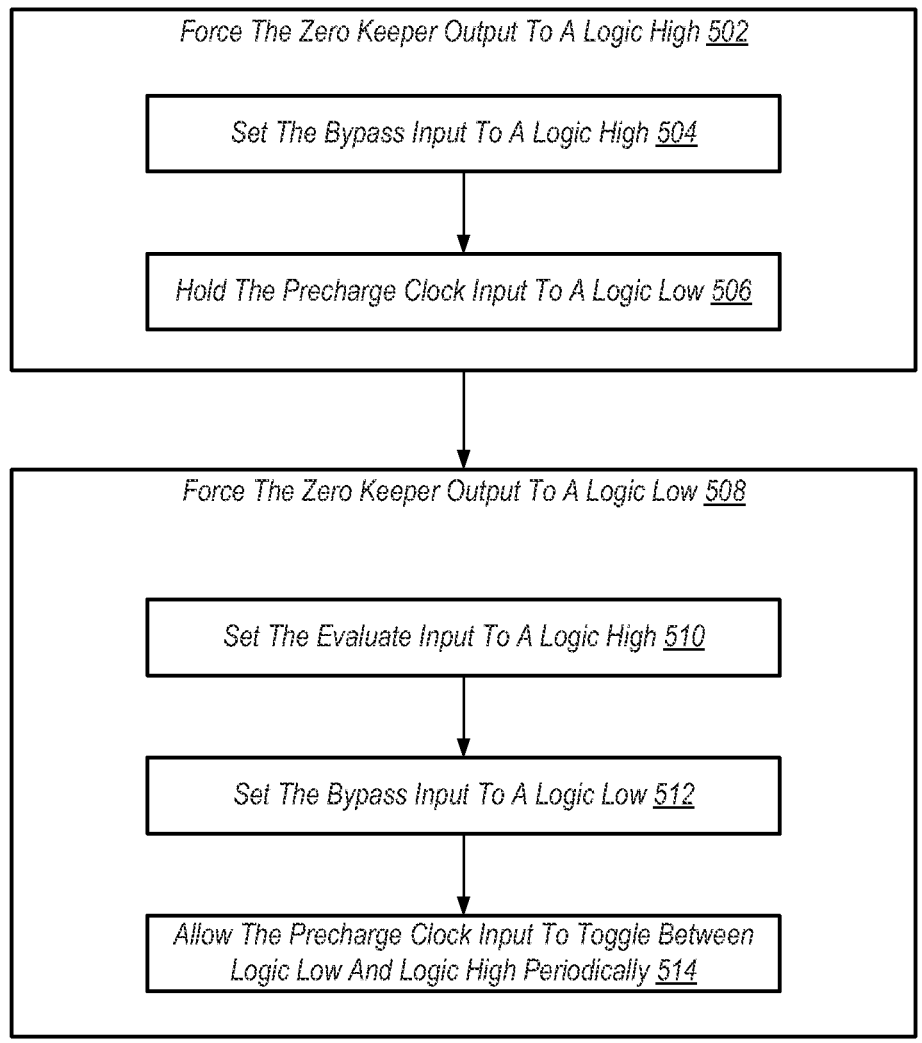
FIG. 5 sets forth a flow chart illustrating an example method of controlling a zero keeper circuit configured for DFT coverage.

For further explanation, FIG. 5 sets forth a flow chart illustrating an example method of controlling an output of a zero keeper circuit. Such a zero keeper circuit may be configured similar to any of the circuits described above with respect to FIG. 3A, FIG. 3B, FIG. 4A, and FIG. 4B.

The method of FIG. 5 includes forcing 502 the zero keeper output to a logic high. In the method of FIG. 5, forcing 502 the zero keeper output to a logic high includes setting 504 the bypass input to a logic high and holding 506 the clock input to a logic low. In embodiments in which the zero keeper output is coupled to an input of AND gate, such as the example circuit of FIG. 3A, forcing 502 the zero keeper output to a logic high bypasses the zero keeper circuit for DFT activity through the AND gate. In embodiments in which the zero keeper output is coupled to an inverter and an OR gate, such as the example circuit of FIG. 4B, forcing 502 the zero keeper output to a logic high bypasses the zero keeper circuit for DFT activity through the inverter and OR gate.

The method of FIG. 5 also includes forcing 508 the zero keeper output to a logic low. In the method of FIG. 5, forcing 508 the zero keeper output to a logic low includes setting 510 the dynamic input to a logic high, setting 512 the bypass input to a logic low, and allowing 514 the clock input to toggle between logic low and logic high periodically. In embodiments in which the zero keeper output is coupled to an OR gate, such as the example circuit of FIG. 3B, forcing 508 the zero keeper output to a logic low bypasses the zero keeper circuit for DFT activity through the OR gate. In embodiments in which the zero keeper output is coupled to an inverter and AND gate, such as the example circuit of FIG. 4A, forcing 508 the zero keeper output to a logic low bypasses the zero keeper circuit for DFT activity through the inverter and AND gate.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A circuit comprising:
a dynamic input PFET connected to a power source and a zero keeper output, wherein the dynamic input PFET is configured to couple the power source to the zero keeper output based on a dynamic input;
a clock input NFET connected to the zero keeper output and a pull-down node, wherein the clock input NFET is configured to couple the zero keeper output to the pull-down node based on a clock input;
a dynamic input NFET connected to the pull-down node and a reference voltage, wherein the dynamic input NFET is configured to couple the pull-down node to the reference voltage based on the dynamic input;
a feedback PFET and a clock input PFET connected in series between the power source and the zero keeper output, wherein the feedback PFET is selectively enabled based on a feedback signal and the clock input PFET is selectively enabled based on the clock input; and
a feedback NFET connected to the zero keeper output and the pull-down node, wherein the feedback NFET is configured to couple the zero keeper output to the pull-down node based on the feedback signal; and a NOR gate configured to output the feedback signal based on the zero keeper output and a bypass input.

2. The circuit of claim 1, wherein the zero keeper output is configured to be forced to a logic high upon:
the bypass input being set to a logic high; and
the clock input held to a logic low.

3. The circuit of claim 2, further comprising an AND gate having a first input coupled to the zero keeper output, a second input coupled to a selectively controllable output of a Design-For-Test ('DFT') module, and an output coupled to scannable logic circuitry, wherein the zero keeper output is configured to bypass, upon being forced to a logic high, the circuit for DFT activity through the AND gate.

4. The circuit of claim 2, further comprising an inverter and an OR gate, wherein:
the inverter comprises an input coupled to the zero keeper output and an output coupled to a first input of the OR gate;
a second input of the OR gate is coupled to a selectively controllable output of a Design-For-Test ('DFT') module;
the output of the OR gate is coupled to scannable logic circuitry; and
the zero keeper output is configured to bypass, upon being forced to a logic high, the circuit for DFT activity through the OR gate.

5. The circuit of claim 1, wherein the zero keeper output is configured to be forced to a logic low upon the dynamic input being set to a logic high, the bypass input being set to a logic low, and the clock input toggling between logic low and logic high periodically.

6. The keeper circuit of claim 5 further comprising an AND gate and an inverter, wherein:
the zero keeper output is coupled to the inverter;
an output of the inverter is coupled to a first input of the AND gate;
a second input of the AND gate is coupled to a selectively controllable output of a Design-For-Test ('DFT') module;
the output of the AND gate is coupled to scannable logic circuitry; and
the zero keeper output is configured to bypass, upon being forced to a logic low, the circuit for DFT activity.

7. The circuit of claim 5 further comprising an OR gate having a first input coupled to the zero keeper output, a second input coupled to a selectively controllable output of a Design-For-Test ('DFT') module, and an output coupled to scannable logic circuitry wherein zero keeper output is configured to bypass, upon being forced to a logic low, the circuit for DFT activity through the OR gate.

8. A method of controlling an output of a zero keeper circuit, the zero keeper circuit comprising a dynamic input PFET connected to a power source and a zero keeper output, wherein the dynamic input PFET is configured to couple the power source to the zero keeper output based on a dynamic input; a clock input NFET connected to the zero keeper output and a pull-down node, wherein the clock input NFET is configured to couple the zero keeper output to the pull-down node based on a clock input; a dynamic input NFET connected to the pull-down node and a reference voltage, wherein the dynamic input NFET is configured to couple the pull-down node to the reference voltage based on the dynamic input; a feedback PFET and a clock input PFET connected in series between the power source and the zero keeper output, wherein the feedback PFET is selectively enabled based on a feedback signal and the clock input PFET is selectively enabled based on the clock input; a feedback NFET connected to the zero keeper output and the pull-down node, wherein the feedback NFET is configured to couple the zero keeper output to the pull-down node based on the feedback signal; and a NOR gate configured to output the feedback signal based on the zero keeper output and a bypass input, the method comprising forcing the zero keeper output to a logic high, including:
 setting the bypass input to a logic high; and
 holding the clock input to a logic low.

9. The method of claim 1, wherein the zero keeper output is coupled to a first input of an AND gate, a second input of the AND gate is coupled to a selectively controllable output of a Design-For-Test ('DFT') module, the output of the AND gate is coupled to scannable logic circuitry, and forcing the zero keeper output to a logic high bypasses the zero keeper circuit for DFT activity through the AND gate.

10. The method of claim 1, wherein the zero keeper output is coupled to an inverter, an output of the inverter is coupled to a first input of an OR gate, a second input of the OR gate is coupled to a selectively controllable output of a Design-For-Test ('DFT') module, the output of the OR gate is coupled to scannable logic circuitry, and forcing the zero keeper output to a logic high bypasses the zero keeper circuit for DFT activity through the OR gate.

11. The method of claim 1 further comprising forcing the zero keeper output to a logic low, including:
 setting the dynamic input to a logic high;
 setting the bypass input to a logic low; and
 allowing the clock input to toggle between logic low and logic high periodically.

12. The method of claim 4 wherein the zero keeper output is coupled to an inverter, an output of the inverter is coupled to a first input of an AND gate, a second input of the AND gate is coupled to a selectively controllable output of a Design-For-Test ('DFT') module, the output of the AND gate is coupled to scannable logic circuitry, and forcing the zero keeper output to a logic low bypasses the zero keeper circuit for DFT activity through the AND gate.

13. The method of claim 4 wherein the zero keeper output is coupled to a first input of an OR gate, a second input of the OR gate is coupled to a selectively controllable output of a Design-For-Test ('DFT') module, the output of the OR gate is coupled to scannable logic circuitry, and forcing the zero keeper output to a logic low bypasses the zero keeper circuit for DFT activity through the OR gate.

14. A device comprising:
 a memory array; and
 a zero keeper circuit coupled to a read output of the memory array, wherein the zero keeper circuit comprises:
  a dynamic input PFET connected to a power source and a zero keeper output, wherein the dynamic input PFET is configured to couple the power source to the zero keeper output based on a dynamic input;
  a clock input NFET connected to the zero keeper output and a pull-down node, wherein the clock input NFET is configured to couple the zero keeper output to the pull-down node based on a clock input;
  a dynamic input NFET connected to the pull-down node and a reference voltage, wherein the dynamic input NFET is configured to couple the pull-down node to the reference voltage based on the dynamic input;
  a feedback PFET and a clock input PFET connected in series between the power source and the zero keeper output, wherein the feedback PFET is selectively enabled based on a feedback signal and the clock input PFET is selectively enabled based on the clock input; and
  a feedback NFET connected to the zero keeper output and the pull-down node, wherein the feedback NFET is configured to couple the zero keeper output to the pull-down node based on the feedback signal; and a NOR gate configured to output the feedback signal based on the zero keeper output and a bypass input.

15. The device of claim 14, wherein the zero keeper output is configured to be forced to a logic high upon:
 the bypass input being set to a logic high; and
 the clock input held to a logic low.

16. The device of claim 15, wherein the zero keeper circuit further comprises an AND gate having a first input coupled to the zero keeper output, a second input coupled to a selectively controllable output of a Design-For-Test ('DFT') module, and an output coupled to scannable logic circuitry, wherein the zero keeper output is configured to bypass, upon being forced to a logic high, the zero keeper circuit for DFT activity through the AND gate.

17. The device of claim 15 wherein:
 the zero keeper circuit further comprises an inverter and an OR gate;
 the inverter comprises an input coupled to the zero keeper output and an output coupled to a first input of the OR gate;
 a second input of the OR gate is coupled to a selectively controllable output of a Design-For-Test ('DFT') module;
 the output of the OR gate is coupled to scannable logic circuitry; and
 the zero keeper output is configured to bypass, upon being forced to a logic high, the zero keeper circuit for DFT activity through the OR gate.

18. The device of claim 14 wherein the zero keeper output is configured to be forced to a logic low upon the dynamic input being set to a logic high, the bypass input being set to a logic low, and the clock input toggling between logic low and logic high periodically.

19. The device of claim 18 wherein:
 the zero keeper circuit further comprises an AND gate and an inverter;
 the zero keeper output is coupled to the inverter;
 an output of the inverter is coupled to a first input of the AND gate;

a second input of the AND gate is coupled to a selectively controllable output of a Design-For-Test ('DFT') module;

the output of the AND gate is coupled to scannable logic circuitry; and the zero keeper output is configured to bypass, upon being forced to a logic low, the zero keeper circuit for DFT activity.

20. The device of claim 18 wherein the zero keeper circuit further comprises an OR gate having a first input coupled to the zero keeper output, a second input coupled to a selectively controllable output of a Design-For-Test ('DFT') module, and an output coupled to scannable logic circuitry wherein zero keeper output is configured to bypass, upon being forced to a logic low, the zero keeper circuit for DFT activity through the OR gate.

21. The device of claim 14 wherein device further comprises a wireless mobile device.

22. A memory apparatus comprising:
an array of memory cells;
a read output; and
a zero keeper circuit coupled to the read output, wherein the zero keeper circuit comprises:
a dynamic input PFET connected to a power source and a zero keeper output, wherein the dynamic input PFET is configured to couple the power source to the zero keeper output based on a dynamic input;
a clock input NFET connected to the zero keeper output and a pull-down node, wherein the clock input NFET is configured to couple the zero keeper output to the pull-down node based on a clock input;
a dynamic input NFET connected to the pull-down node and a reference voltage, wherein the dynamic input NFET is configured to couple the pull-down node to the reference voltage based on the dynamic input;
a feedback PFET and a clock input PFET connected in series between the power source and the zero keeper output, wherein the feedback PFET is selectively enabled based on a feedback signal and the clock input PFET is selectively enabled based on the clock input; and
a feedback NFET connected to the zero keeper output and the pull-down node, wherein the feedback NFET is configured to couple the zero keeper output to the pull-down node based on the feedback signal; and a NOR gate configured to output the feedback signal based on the zero keeper output and a bypass input.

23. The memory apparatus of claim 22, wherein the zero keeper output is configured to be forced to a logic high upon:
the bypass input being set to a logic high; and
the clock input being held to a logic low.

24. The memory apparatus of claim 23, wherein the zero keeper circuit further comprises an AND gate having a first input coupled to the zero keeper output, a second input coupled to a selectively controllable output of a Design-For-Test ('DFT') module, and an output coupled to scannable logic circuitry, wherein the zero keeper output is configured to bypass, upon being forced to a logic high, the zero keeper circuit for DFT activity through the AND gate.

25. The memory apparatus of claim 23 wherein:
the zero keeper circuit further comprises an inverter and an OR gate;
the inverter comprises an input coupled to the zero keeper output and an output coupled to a first input of the OR gate;
a second input of the OR gate is coupled to a selectively controllable output of a Design-For-Test ('DFT') module;
the output of the OR gate is coupled to scannable logic circuitry; and
the zero keeper output is configured to bypass, upon being forced to a logic high, the zero keeper circuit for DFT activity through the OR gate.

* * * * *